US011611332B1

(12) United States Patent
Rettinger (10) Patent No.: US 11,611,332 B1
(45) Date of Patent: Mar. 21, 2023

(54) GATE DRIVER HAVING INPUT AND OUTPUT SIDES GALVANICALLY ISOLATED FROM ONE ANOTHER

(71) Applicant: Infineon Technologies Austria AG, Villach (AT)

(72) Inventor: Heiko Rettinger, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/541,482

(22) Filed: Dec. 3, 2021

(51) Int. Cl.
*H03K 3/00* (2006.01)
*H03K 17/0412* (2006.01)
*H03K 17/687* (2006.01)
*H03K 17/691* (2006.01)
*H03K 3/012* (2006.01)

(52) U.S. Cl.
CPC ........... *H03K 3/012* (2013.01); *H03K 17/687* (2013.01)

(58) Field of Classification Search
None
See application file for complete search history.

(56) References Cited

U.S. PATENT DOCUMENTS

| 8,344,762 B2* | 1/2013 | Terashi | H02M 1/08 327/108 |
| 9,590,621 B2* | 3/2017 | Young | H03K 17/0412 |
| 11,302,518 B2* | 4/2022 | Prager | H01L 21/6833 |

* cited by examiner

*Primary Examiner* — Kenneth B Wells
(74) *Attorney, Agent, or Firm* — Murphy, Bilak & Homiller, PLLC (57) ABSTRACT

A gate driver includes: an input pin for receiving switching control information from a controller; an output pin for driving a control terminal of a power transistor; a power supply pin for receiving power from an external supply; an input side electrically connected to the input pin; an output side electrically connected to the output pin and the power supply pin; and an isolation structure galvanically isolating the input side and the output side from one another. The output side is configured to transfer a fraction of the power received at the power supply pin to the input side over the isolation structure for powering the input side. The input side is configured to convey the switching control information received at the input pin to the output side over the isolation structure. A power electronic system that includes the gate driver is also described.

22 Claims, 8 Drawing Sheets

GATE DRIVER HAVING INPUT AND OUTPUT SIDES GALVANICALLY ISOLATED FROM ONE ANOTHER

BACKGROUND

Insulated gate drivers can achieve power transmission over an insulation barrier by various methods. However, these implementations consider power transfer from a (low voltage) logic input side to an insulated and potentially high voltage side. At the high voltage side, the transferred power is used to operate a sensor or provide current for charging and discharging of an external power switch. In most insulated gate drivers, the power requirement for the high voltage capable gate driving stage is typically higher than the power consumed by the logic circuitry on the low voltage side. However, the power transmission capability of coreless transformers is quite limited due to the lack of a magnetic core and transformers with a core occupy significantly more area. Furthermore, the transmission of a large amount of power (e.g., 0.2 W or more) for gate driving results in an immense power loss within the package. In addition, SiC (silicon carbide) MOSFETs (metal-oxide-semiconductor field-effect transistors) usually require a very accurate gate voltage supply which suggests an external power supply solution. Accordingly, conventional insulated gate driver solutions typically have an input voltage supply for the logic circuitry and a separate output voltage supply for the gate driver circuitry.

Thus, there is a need for an improved insulated gate driver solution.

SUMMARY

According to an embodiment of a gate driver, the gate driver comprises: an input pin for receiving switching control information from a controller; an output pin for driving a control terminal of a power transistor; a power supply pin for receiving power from an external supply; an input side electrically connected to the input pin; an output side electrically connected to the output pin and the power supply pin; and an isolation structure galvanically isolating the input side and the output side from one another, wherein the output side is configured to transfer a fraction of the power received at the power supply pin to the input side over the isolation structure for powering the input side, wherein the input side is configured to convey the switching control information received at the input pin to the output side over the isolation structure.

According to an embodiment of a power electronic system, the power electronic system comprises: a power transistor module; a controller; a power supply; and a gate driver comprising: an input pin for receiving switching control information from the controller; an output pin for driving a control terminal of a power transistor included in the power transistor module; a power supply pin for receiving power from the power supply; an input side electrically connected to the input pin; an output side electrically connected to the output pin and the power supply pin; and an isolation structure galvanically isolating the input side and the output side from one another such that the controller is galvanically isolated from the power transistor module, wherein the output side is configured to transfer a fraction of the power received at the power supply pin to the input side over the isolation structure for powering the input side, wherein the input side is configured to convey the switching control information received at the input pin to the output side over the isolation structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an insulated gate driver solution where power transfer occurs from the high voltage side to the low voltage side over an isolation structure, for powering logic circuitry on the low voltage side. Total power consumption at the high voltage side includes power consumed by circuitry on the high voltage side, power consumed by circuitry on the low voltage side, and conversion losses. High power modules that include one or more power transistors configured for power conversion or inversion applications require a large amount of gate charge which in turn requires an external power supply capable of supplying current in the range of tens of amperes or higher. The power requirement on the low voltage side is significantly lower, e.g., in the mW range, and is readily supplied by the external power supply for the high voltage side. Transferring a fraction of the power received from the external power supply to the low voltage side over an isolation structure for powering logic circuitry on the low voltage side significantly reduces the amount of power dissipation as compared to transferring power from the low voltage side to the high voltage side.

Without a supply voltage at the high voltage side, no operation is possible at the low voltage side. Accordingly, safe-torque-off requirements may be implemented by cutting power to the gate driver supply circuit on the high voltage side.

The same isolation structure that galvanically isolates the high and low voltage sides from one another may be used for signal transmission from the low voltage side to the high voltage side, reducing the amount of area required for a product with similar capabilities. Optional data transmission from the high voltage side to the low voltage side may be implemented by amplitude modulation, frequency modulation, or a combination of both. In the opposite direction, the low voltage side may actively vary the load condition (impedance) of the power transmission to communicate with the high voltage side. During start-up, both sides may use predefined signal patterns to calibrate and tune both sender and receiver parts to guard against false detection during subsequent operation. Such a sequence can improve overall system accuracy and performance. The galvanic isolation between the high and low voltage sides is not limited to a specific technology or insulation barrier and may utilize any electromagnetic field-based insulation technology.

Described next, with reference to the figures, are exemplary embodiments of the insulated gate driver and a power electronic system that uses the insulated gate driver.

Figure 1:
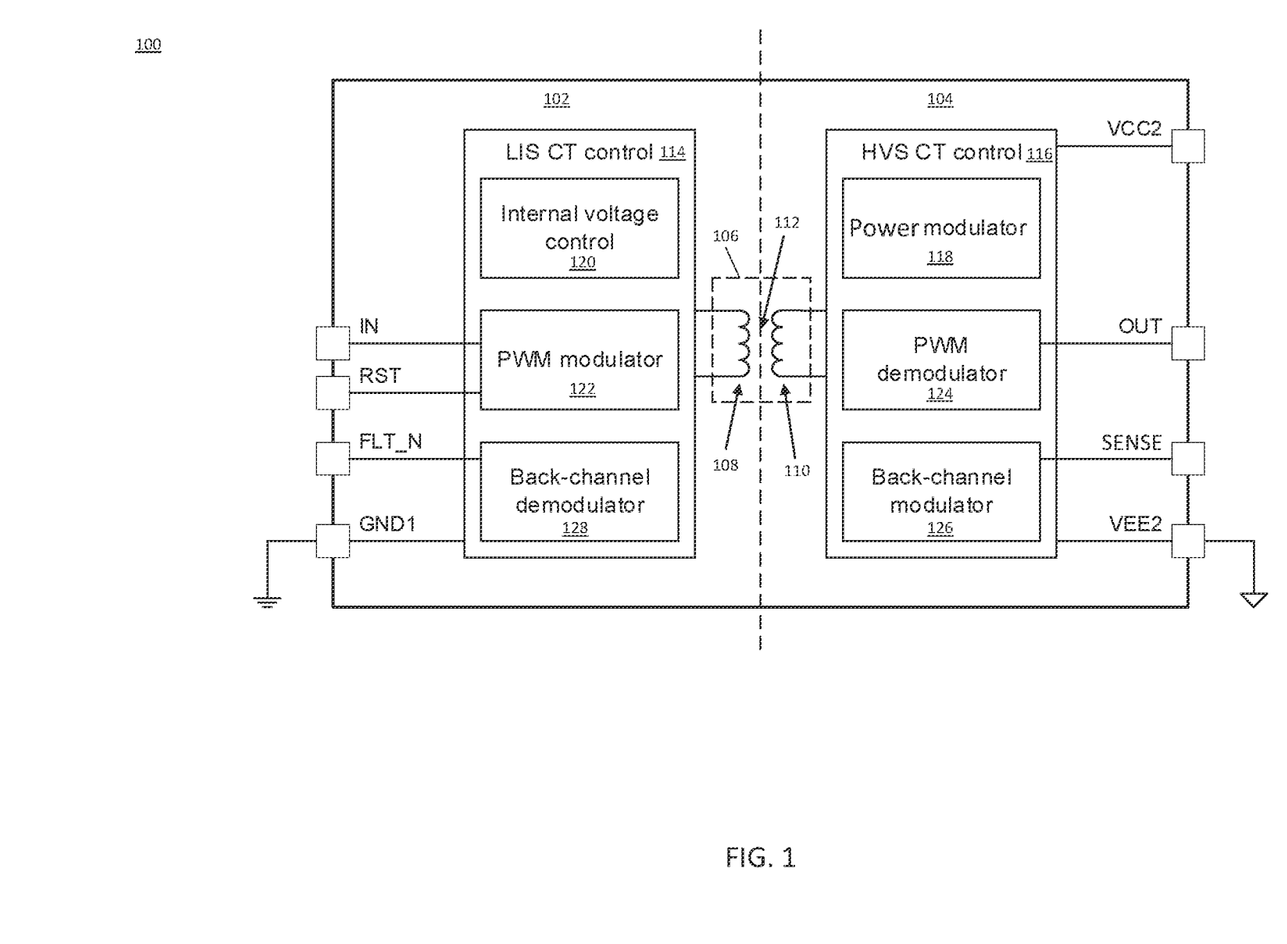
FIG. 1 illustrates a schematic embodiment of an insulated gate driver.

FIG. 1 illustrates a schematic embodiment of an insulated gate driver 100. The insulated gate driver includes an input pin 'IN' for receiving switching control information from a controller (not shown in FIG. 1), an output pin 'OUT' for driving a control terminal of a power transistor (not shown in FIG. 1), a power supply pin 'VCC2' for receiving power from an external supply (not shown in FIG. 1), and a ground or reference pin 'VEE2'. An input (low voltage) side 102 of the insulated gate driver 100 is electrically connected to the input pin IN. An output side 104 of the insulated gate driver 100 is electrically connected to the output pin OUT and the power supply pin VCC2.

An isolation structure 106 galvanically isolates the input side 102 and the output side 104 from one another. The galvanic isolation provided by the isolation structure 106 is indicated by the dashed vertical line in FIG. 1. In one embodiment, the isolation structure 106 is a coreless transformer having a first coil 108 electrically connected to the input side 102, a second coil 110 electrically connected to the output side, and an isolation barrier 112 separating the first coil 108 and the second coil 110 from one another. In general, the isolation structure 106 may utilize any electromagnetic field-based insulation technology. For example, the isolation structure 106 instead may be a capacitive coupler where the transformer coils 108, 110 are replaced by corresponding field plates electrically connected to the respective side 102, 104 of the insulated gate driver 100 and separated from one another by the isolation barrier 112.

Regardless of the type of isolation structure 106 used to galvanically isolate the input side 102 and the output side 104 of the insulated gate driver 100 from one another, the output side 104 is configured to transfer a fraction of the power received at the power supply pin VCC2 to the input side 102 over the isolation structure 106 for powering the input side 102. The input side 102 is configured to convey switching control information received at the input pin IN to the output side 104 over the isolation structure 106. Accordingly, the input side 102 does not require a separate (external) power supply for the circuitry on the input side 102 and the switching control information for controlling each power transistor driven by the insulated gate driver 100 is communicated over the same isolation barrier 112 used to transfer power from the output side 104 to the input side 102.

The input side 102 of the insulated gate driver 100 includes control circuitry 114 such as a controller, etc. and the output side 104 includes control circuitry 116 such as a controller, etc. for enabling both the signalling techniques and the output-to-input power transfer techniques described herein over the isolation structure 106. The output side control circuitry 116 includes a power modulator 118 for transferring a fraction of the power received at the power supply pin VCC2 to the input side 102 over the isolation structure 106, and the input side control circuitry 114 correspondingly includes internal voltage control circuitry 120 such as rectification and supply stabilization circuitry for powering the circuitry on the input side 102 using the power transferred from the output side 104 over the isolation structure 106. The input side control circuitry 114 also includes a signal modulator 122 such as a PWM (pulse width modulation) modulator for conveying switching control information received at the input pin IN to the output side 104 over the isolation structure 106, and the output side control circuitry 116 correspondingly includes a signal demodulator 124 such as a PWM demodulator for demodulating the switching control information transferred from the input side 102 over the isolation structure 106. In the case of bi-directional signalling capability, the output side control circuitry 116 may include a back-channel signal modulator 126 for conveying information to the input side 102 over the same isolation structure 106, and the input side control circuitry 114 correspondingly includes a back-channel signal demodulator 128 for demodulating the information received from the output side 104 over the isolation structure 106.

Regarding power transmission from the output side 104 to the input side 102 of the insulated gate driver 100, gate supply voltages for power transistors such as power MOSFETs, IGBTs (insulated gate bipolar transistors), HEMTs (high-electron mobility transistors), JFETs (junction field-effect transistors), etc. are typically above 10 V. Such gate supply voltages allow for higher flexibility in implementing the output-to-input side power transmission scheme. For example, in the case of a coreless transformer as the isolation structure 106, the number of windings, frequency, modulation, etc. implemented by the power modulator 118 included in or associated with the output side control circuitry 116 may be selected to deliver the desired power transmission capability. In the case of a capacitive coupler as the isolation structure 106, charge pump, frequency, modulation, etc. implemented by the output side power modulator 118 may be selected to deliver the desired power transmission capability. Relatively low power consumption on the input side 102, e.g., in the mW range for the input side 102 and 1 watt or higher for the output side 104, ensures the additional power loss at the output side 104 is relatively low which in turn makes the insulated gate driver solution described herein suitable for a broad range of applications and switching power modules including IGBT modules, SiC MOSFET modules, etc.

Regarding signal transmission over the isolation structure 106 of the insulated gate driver 100, the input side 102 may convey switching control information received at the input pin IN to the output side 104 over the isolation structure 106 by modulating the load impedance for the input side 102 as seen by the output side 104. Various techniques may be used to modulate the load impedance seen by the output side 104. In each case, the impedance change is large enough for the output side 104 to distinguish between regular power requirement fluctuations at the input side 102 and small enough to avoid overloading the power transmission capabilities of the output side 104.

In one embodiment, the fraction of the power transferred from the output side 104 to the input side 102 over the isolation structure 106 includes a time-varying component having a slope effected by the modulated load impedance seen by the output side 104. According to this embodiment, the signal demodulator 124 included in or associated with the output side control circuitry 116 detects the slope of the time-varying component and drives the output pin OUT based on the detected slope.

Figure 2:
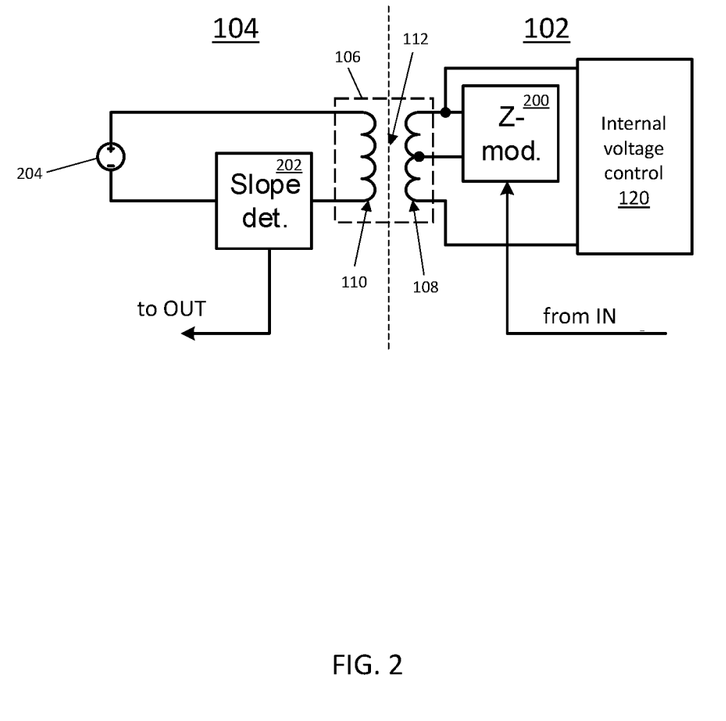
FIG. 2 illustrates an embodiment of a modulated load impedance signalling technique implemented by the insulated gate driver.

FIG. 2 illustrates an embodiment of the modulated load impedance technique. According to this embodiment, switching control information received at the input pin IN on the input side 102 of the insulated gate driver 100 is a PWM signal that transitions between a logic low level and a logic high level with a variable duty cycle. The signal modulator 122 included in or associated with the input side control circuitry 114 includes an impedance modulator 200 that changes the load impedance 'Z' seen by the output side 104 each time the PWM signal transitions from the logic low level to the logic high level or from the logic high level to the logic low level. In other words, the impedance modulator 200 changes the load impedance Z seen by the output side 104 based on the duty cycle of the PWM signal. The power transmission from the output side 104 may have a sinusoidal waveform. The amount of power drawn by the input side 102 depends on the impedance seen by the output side 104. The impedance modulator 200 may include a switch device that actively changes the amount of current draw which in turn changes the impedance seen by the output side 104. For example, 1 mA may be drawn for one type of signal and 2 mA may be drawn for another type of signal.

The signal demodulator 124 included in or associated with the output side control circuitry 116 includes a slope detector 202 and a pulse generator 204 for detecting changes in the slope of the load impedance seen by the output side 104, and driving the output pin OUT to a first voltage level if the detected slope is below a threshold and to a second voltage level if the detected slope exceeds the threshold. The first voltage level corresponds to the logic low level of the PWM signal received on the input side 102, and the second voltage level corresponds to the logic high level of the PWM signal received on the input side 102.

Figure 3:
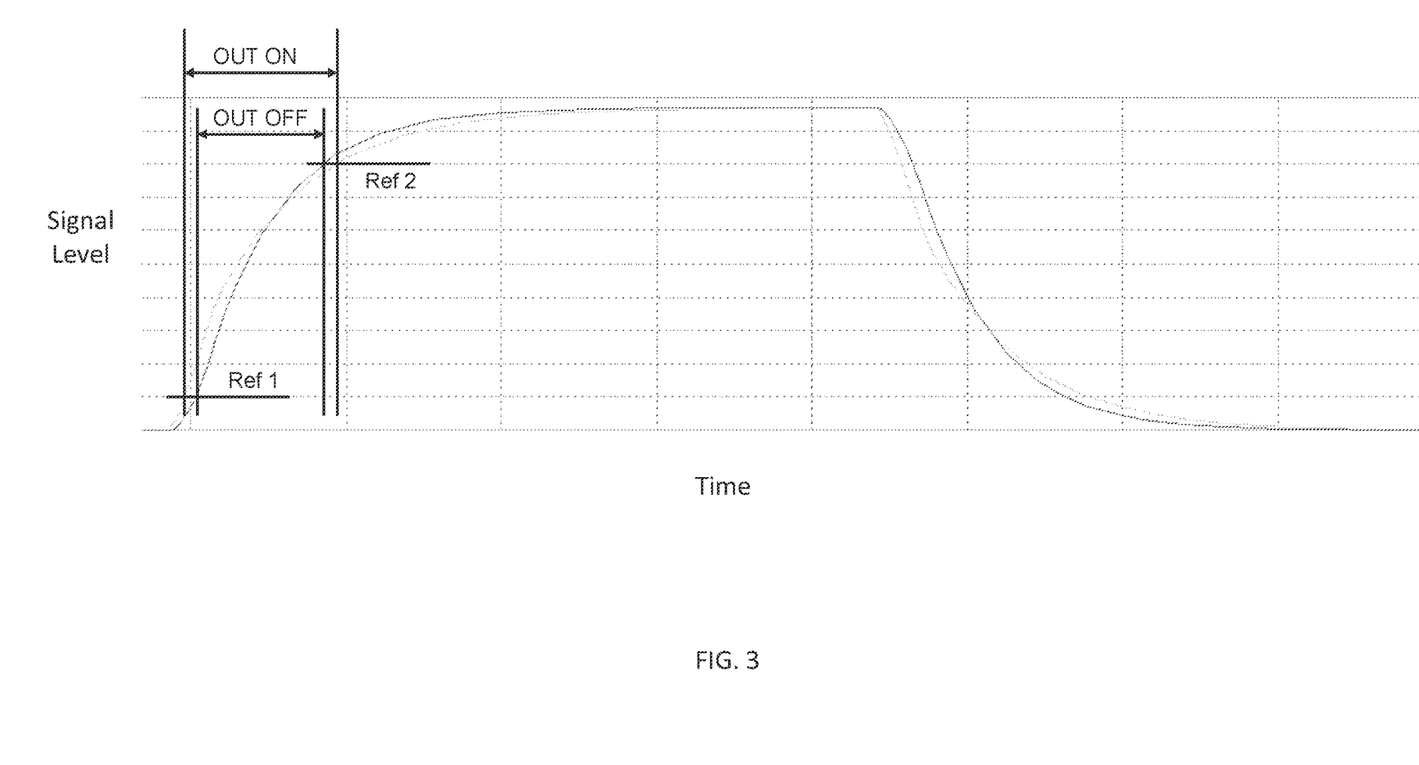
FIG. 3 illustrates an embodiment of a slope detection scheme implemented on the output side of the insulated gate driver.

FIG. 3 illustrates an embodiment of the slope detection implemented by the slope detector 202 on the output side 104 of the insulated gate driver 100. If the signal detected by the slope detector 202 transitions from a first reference level Ref 1 to a second reference level Ref 2 within a predetermined time period facilitated in conjunction with the pulse generator 204, then the output side signal demodulator 124 drives the output pin OUT to the first voltage level to indicate, e.g., an 'OFF' level. If, however, the signal detected by the slope detector 202 transitions from Ref 1 to Ref 2 outside the predetermined time period, then the signal demodulator 124 drives the output pin OUT to the second voltage level, e.g., an 'ON' level.

Figure 4:
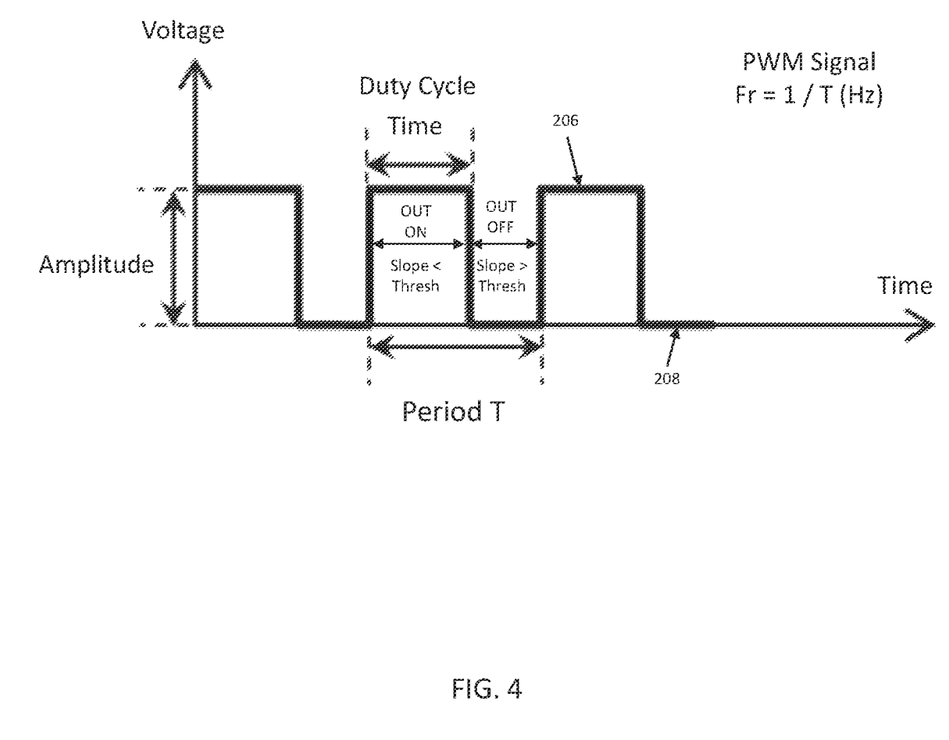
FIG. 4 illustrates an embodiment of a switching control signal reconstructed on the output side of the insulated gate driver using a slope detection scheme.

FIG. 4 illustrates an embodiment of the signal at the output pin OUT on the output side 104 of the insulated gate driver 104. The output pin OUT is driven to a first voltage level 206 if the detected slope is below the slope threshold and to a second voltage level 208 if the detected slope exceeds the threshold. The duty cycle of the signal at the output pin OUT depends on how long the first voltage level 206 remains active, and the switching period 'T' corresponds to the total duration at the first voltage level 206 and at the second voltage level 208 before transitioning again to the first voltage level 206. Accordingly, the switching frequency Fr of the signal at the output pin OUT corresponds to 1/T. In effect, the output side signal demodulator 124 reconstructs the PWM signal received on the input side 102 based on detected changes in the slope of the load impedance seen by the output side 104.

The signal transmission over the isolation structure 106 may be bi-directional. That is, in addition to communicating switching control information from the input side 102 to the output side 104 over the isolation structure 106, the back-channel signal modulator 126 included in or associated with the output side control circuitry 116 may convey information to the input side 102 over the same isolation structure 106. The output side back-channel signal modulator 126 may use amplitude modulation, frequency modulation, or a combination of both to ensure that power is still transmitted but the variation is clearly distinguishable from normal operational fluctuations (tolerances).

In one embodiment, the output side 104 of the insulated gate driver 100 includes a sensor pin 'SENSE' as shown in FIG. 1 for receiving a sensed parameter of the power transistor such as current, voltage, temperature, etc. and the output side back-channel modulator 126 conveys the sensed parameter received at the sensor pin SENSE to the input side back-channel signal demodulator 128 over the same isolation structure 106 used for output-to-input side power transfer and input-to-output side signal transfer.

Figure 5:
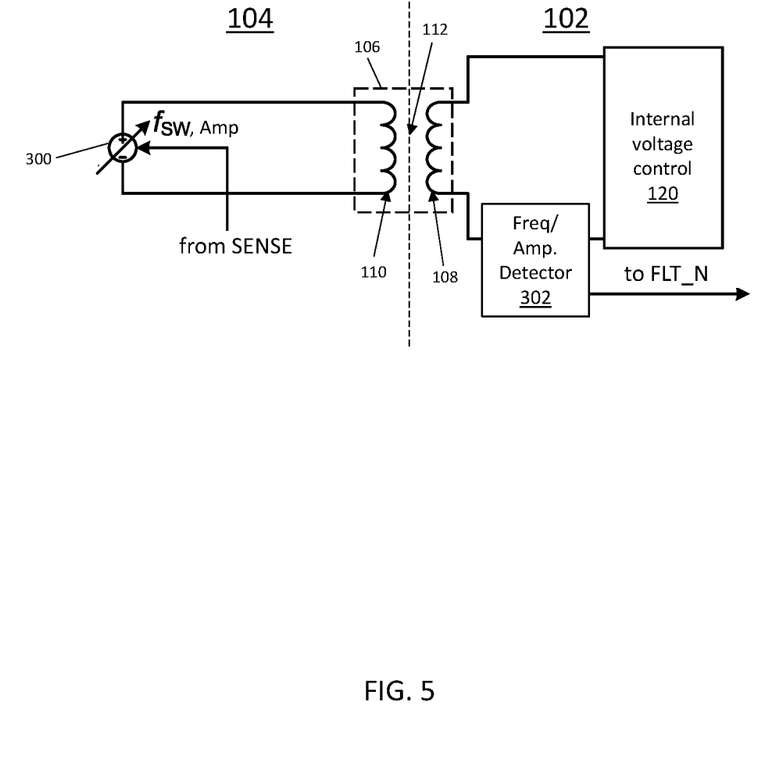
FIG. 5 illustrates an embodiment of a back-channel signalling scheme implemented by the insulated gate driver.

FIG. 5 illustrates an embodiment according to which the back-channel modulator 126 on the output side 104 of the insulated gate driver 100 includes a pulse generator 300. The pulse generator 300 has an adjustable switching frequency 'fsw' and/or amplitude 'Amp' for conveying a sensed parameter received at the sensor pin SENSE to the input side 102 over the isolation structure 106. The corresponding back-channel demodulator 128 on the input side 102 may include a frequency and/or amplitude detector 302 for detecting the sensed parameter conveyed from the output side 104 to the input side 102 over the isolation structure 106 based on the switching frequency and/or amplitude.

Figure 6:
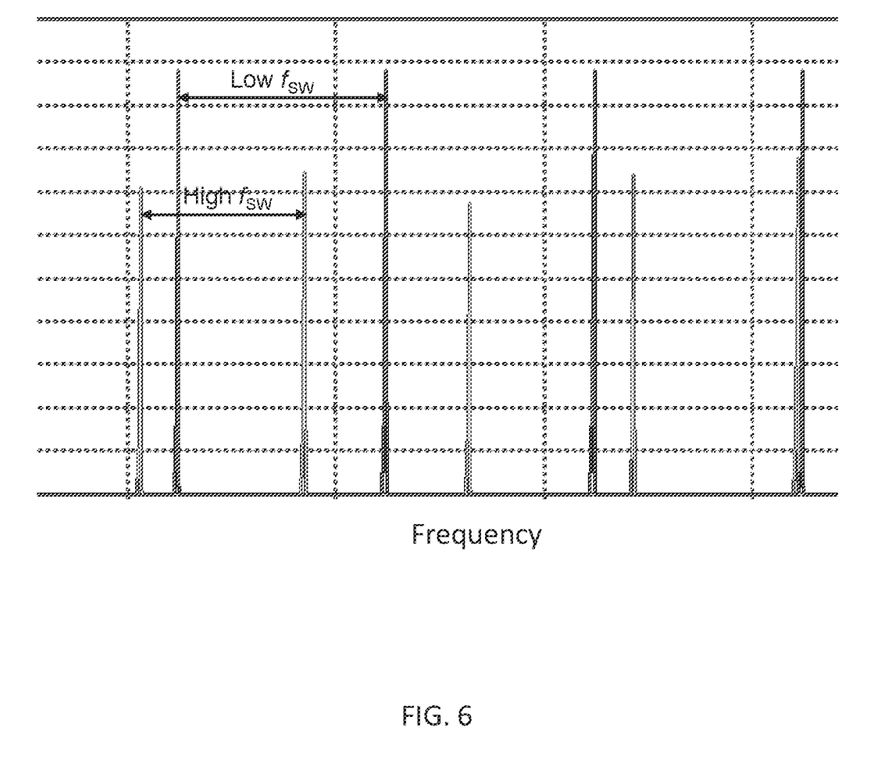
FIG. 6 illustrates a frequency modulation embodiment of the back-channel signalling scheme.

FIG. 6 illustrates an embodiment according to which the pulse generator 300 on the output side 104 has an adjustable switching frequency 'fsw' and the detector 302 on the input side 102 detects the sensed parameter conveyed from the output side 104 to the input side 102 over the isolation structure 106 based on the switching frequency. In this embodiment, the output side back-channel modulator 126 conveys a sensed parameter received at the sensor pin SENSE to the input side 102 by changing the switching frequency between a lower switching frequency 'Low fsw' and a higher switching frequency 'High fsw'. The input side detector 302 detects the sensed parameter based on the elapsed time between pulses. For example, low frequency pulses may be used during normal operation to minimize stress on all involved components. High frequency pulses may be used to communicate an active sensor signal, ensuring stable power transmission while signalling the potential need for action on the input side 102. A similar approach may be used with amplitude modulation, or a combination of both frequency and amplitude modulation.

The insulated gate driver 100 may include an error detection pin 'FLT_N' on the input side 102 as shown in FIG. 1, for outputting an error detection signal. The input side control circuitry 114 may generate the error detection signal if the sensed parameter conveyed from the output side 104 to the input side 102 over the isolation structure 106 indicates an error.

The insulated gate driver 100 may include a restart pin 'RST' on the input side 102 as shown in FIG. 1, for receiving a restart signal. In response to the restart signal, the insulated gate driver 100 restarts the gate driver operation and clears an error indication on the error detection pin FLT_N. The input side 102 and the output side 104 of the insulated gate driver 100 may each be configured to implement a calibration process during startup of the gate driver 100, to ensure proper communication during normal operation.

Figure 7:
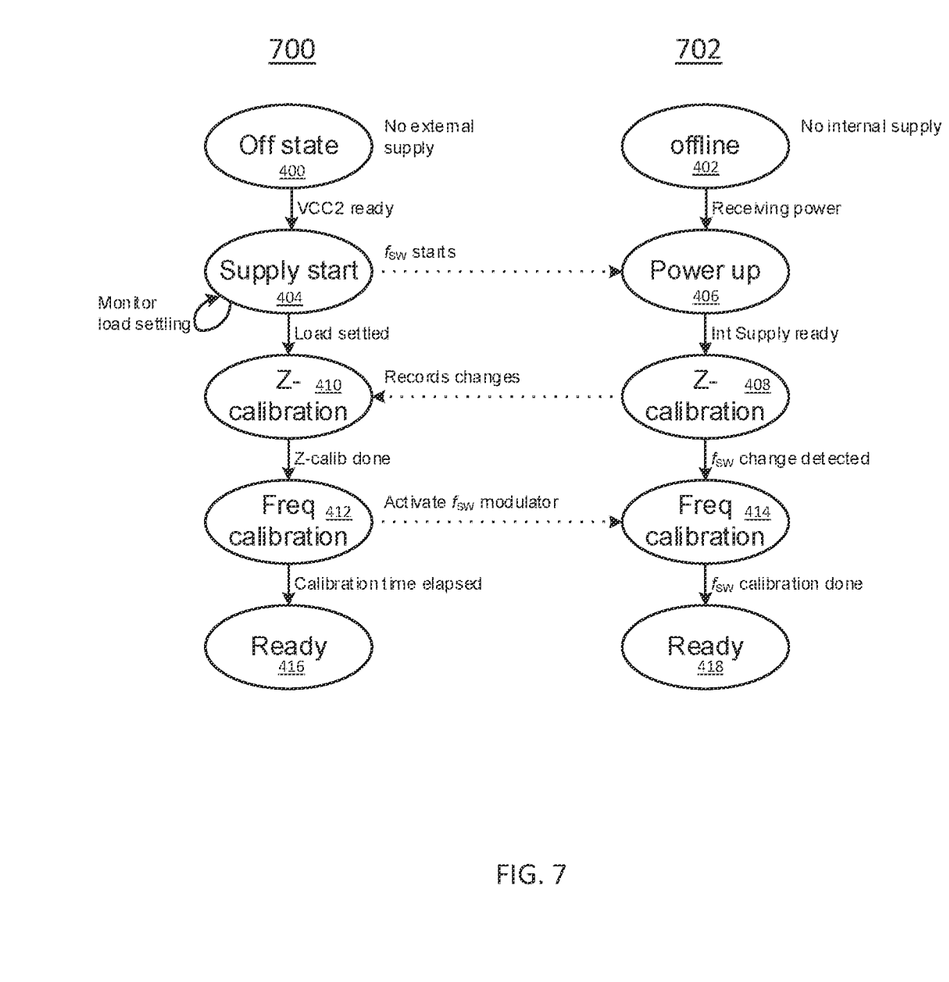
FIG. 7 illustrates an embodiment of a calibration process implemented by the insulated gate driver.

FIG. 7 illustrates an embodiment of the calibration process. Side 700 of FIG. 7 represents the states of the output side 104 and side 702 represents the states of the input side 102. Arrows with straight lines indicate state changes and internal actions of each individual side 102, 104. Arrows with curved lines indicate no state change. Arrows with dotted lines indicate interaction with the opposite side 102/104 to trigger the indicated state change.

With no power provided by the external supply for the output side 104 of the insulated gate driver 100 ('No external supply'), the output side 104 remains in an OFF state (Block 400) and the input side 102 is correspondingly offline (Block 402) with no internal supply ('No internal supply'). When a voltage is provided ('VCC2 ready') at the power supply pin VCC2 on the output side 104 of the insulated gate driver 100, the output side control circuitry 116 initiates a power supply start routine and the power modulator 118 begins transferring ('fsw starts') a fraction of the power received at the power supply pin VCC2 to the input side 102 over the isolation structure 106 (Block 404) to the input side 102 over the isolation structure 106 (Block 404) triggering the corresponding state change ('Receiving power').

The internal voltage control circuitry 120 on the input side 102 initiates a power-up routine, including stabilizing the internal supply of the input side 102 based on the fraction of the power transferred from the output side 104 to the input side 102 over the isolation structure 106 (Block 406). The input side control circuitry 114 activates modulation of the input-side load impedance (Block 408) when the internal supply on the input side 102 is ready ('Int Supply ready'.

In parallel, the output side control circuitry 116 monitors the input-side load impedance ('Monitor load setting') as seen by the output side 104 for settling ('Load settled'). The output side control circuitry 116 then transitions to an impedance calibration state (Block 410, 'Z-calibration') and monitors changes in the input-side load impedance as triggered by the input side 102 ('Records changes' from Block 408). Once the output side control circuitry 116 clearly distinguishes between the two load conditions, the output side control circuitry 116 transitions with an impedance calibration done indication ('Z-calib done') to a frequency calibration state (Block 412). The output side control circuitry 116 also initiates switching frequency modulation ('Activate fsw modulator') with the input side 102 over the isolation structure 106 (Block 412).

The input side control circuitry 114 detects ('fsw change detected') the switching frequency modulation initiated by the output side 106 and transitions to a frequency calibration state (Block 414). When the calibration window closes ('Calibration time elapsed'), the output side control circuitry 116 transitions to a ready ('Ready) state (Block 416). The output side control circuitry 116 also returns the switching frequency fsw used during the calibration process to normal operation. The input side control circuitry 114 also is ready for normal operation ('fsw calibration done') after the calibration process completes (Block 418).

Figure 8:
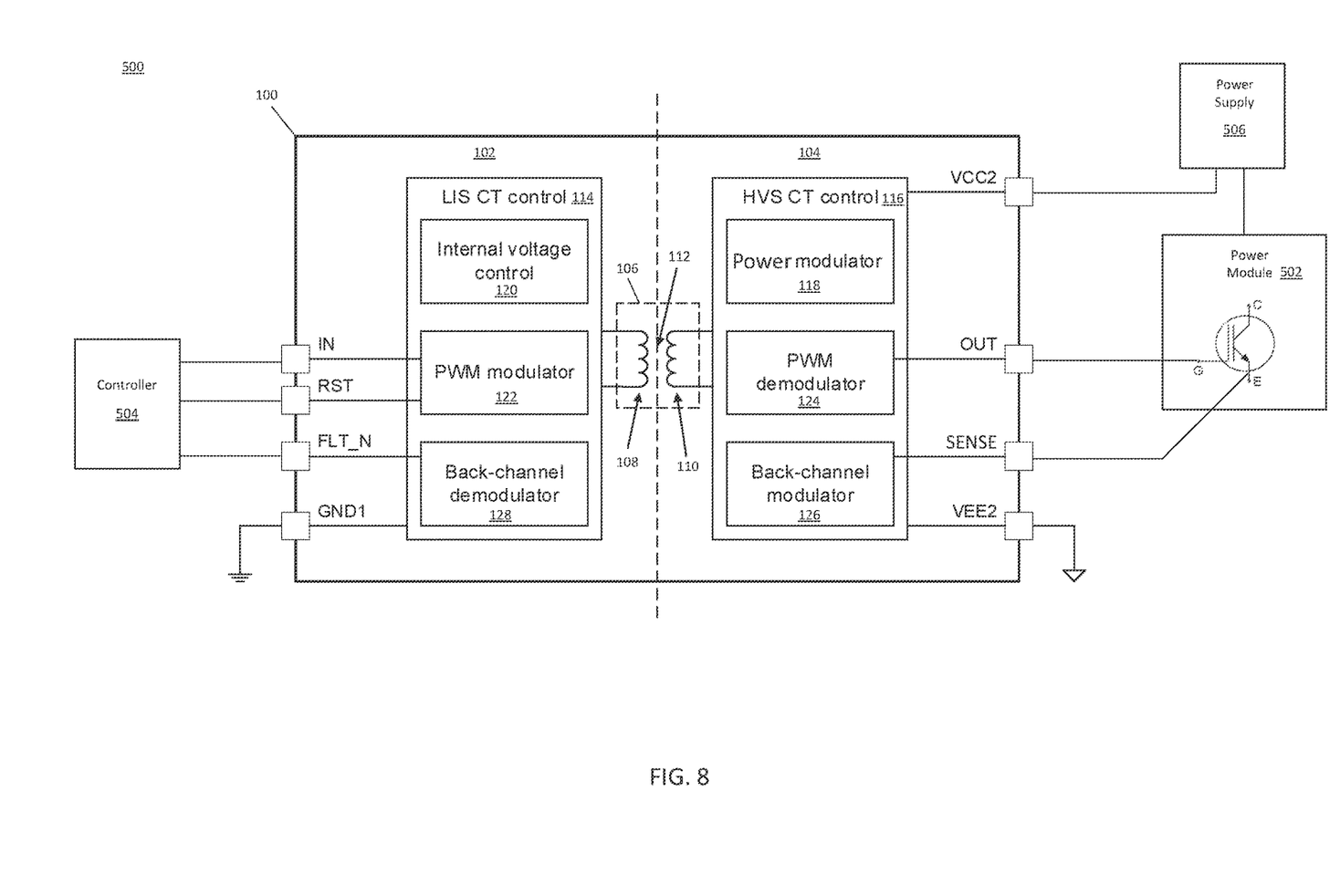
FIG. 8 illustrates an embodiment of a power electronic system that includes the insulated gate driver.

FIG. 8 illustrates an embodiment of a power electronic system 500 that includes the insulated gate driver 100. The power electronic system 500 also includes one or more power transistor modules 502, a controller 504 and a power supply 506. The gate driver output side 104 and power module(s) 502 may share the same power supply 506 as shown in FIG. 8, or separate supplies may be used. The power transistor module 502 illustrated in FIG. 8 is shown as including one or more IGBTs each having a collector 'C', an emitter 'E' and a gate 'G' driven by the insulated gate driver 100. In general, each power transistor module 502 included in the power electronic system 500 may include any type of power transistor devices such as IGBTs, HEMTs, power MOSFETs, JFETs, etc. The controller 504 implements logic-level control of each power transistor module 502, and the insulated gate driver 100 adapts the logic-level control into sufficient gate charge for the power transistor devices. The power electronic system 500 may be a power converter, a power inverter, etc.

The input pin IN of the insulated gate driver 100 receives switching control information from the controller 504. The output pin OUT of the insulated gate driver 100 drives the control terminal of each power transistor included in the power transistor module 502. The power supply pin VCC2 of the insulated gate driver 100 receives power from the (external) power supply 506. The output side 104 of the insulated gate driver 100 transfers a fraction of the power received at the power supply pin VCC2 to the input side 102 of the insulated gate driver 100 over the isolation structure 106 for powering the input side 102, as previously described herein.

The input side 102 of the insulated gate driver 100 conveys the switching control information received from the controller 504 at the input pin IN at the output side 104 of the insulated gate driver 100 over the isolation structure 106, as previously described herein. The signal communication may be bi-directional, as previously described herein. For example, in FIG. 8, emitter current may be sensed at the sensor pin SENSE on the output side 104 of the insulated gate driver 100. The output side back-channel modulator 126 may convey the sensed emitter (E) current received at the sensor pin SENSE to the input side back-channel signal demodulator 128 over the same isolation structure 106 used for output-to-input side power transfer and input-to-output side signal transfer. The sensor pin SENSE may be connected to the collector (C) of the power transistor, instead. Still other sensor pin connections are contemplated, and other parameters may be sensed at the output side sensor pin SENSE, e.g., such as voltage, temperature, etc.

The insulated gate driver 100 may output an error signal on the error detection pin FLT_N at the input side 102 of the driver 100, e.g., if the sensed parameter received at the output side sensor pin SENSE and conveyed to the input side 102 indicates a problem with the power module 502 such as an over or under voltage condition, an excessive current condition, an excessive temperature condition, etc. The controller 504 may take corrective action in response. For example, the controller 504 may deactivate the power module 502, shut down the power electronic system 500, etc. The controller 504 may output a restart signal for initiating a restart of the insulated gate driver 100. The insulated gate driver 100 may store the fault condition detected by the output side 104 and wait for a confirmation by the controller 504 before attempting a restart of the driver operation. The insulated gate driver 100 receives the restart signal at the restart pin RST on the input side 102 of the driver 100. In response to the restart signal, the insulated gate driver 100 restarts the gate driver operation and clears the error indication on the error detection pin FLT_N. The controller 504 may resume use of the affected power module 502 in response to the error indication on the error detection pin FLT_N being cleared, for example.

Although the present disclosure is not so limited, the following numbered examples demonstrate one or more aspects of the disclosure.

Example 1. A gate driver, comprising: an input pin for receiving switching control information from a controller; an output pin for driving a control terminal of a power transistor; a power supply pin for receiving power from an external supply; an input side electrically connected to the input pin; an output side electrically connected to the output pin and the power supply pin; and an isolation structure galvanically isolating the input side and the output side from one another, wherein the output side is configured to transfer a fraction of the power received at the power supply pin to the input side over the isolation structure for powering the input side, wherein the input side is configured to convey the switching control information received at the input pin to the output side over the isolation structure.

Example 2. The gate driver of example 1, wherein the input side is configured to convey the switching control information received at the input pin to the output side over the isolation structure by modulating a load impedance for the input side as seen by the output side.

Example 3. The gate driver of example 2, wherein the fraction of the power transferred from the output side to the input side over the isolation structure includes a time-varying component having a slope effected by the modulated load impedance, and wherein the output side is configured to detect the slope of the time-varying component and drive the output pin based on the detected slope.

Example 4. The gate driver of example 3, wherein the switching control information received at the input pin is a PWM (pulse width modulation) signal having a logic low level and a logic high level, wherein the input side is configured to change the load impedance each time the PWM signal transitions from the logic low level to the logic high level or from the logic high level to the logic low level, wherein the output side is configured to drive the output pin to a first voltage level if the detected slope is below a threshold and to a second voltage level if the detected slope exceeds the threshold, wherein the first voltage level corresponds to the logic low level of the PWM signal, and wherein the second voltage level corresponds to the logic high level of the PWM signal.

Example 5. The gate driver of any of examples 1 through 4, further comprising: a sensor pin at the output side for receiving a sensed parameter of the power transistor, wherein the output side is configured to convey the sensed parameter received at the sensor pin to the input side over the isolation structure.

Example 6. The gate driver of example 5, wherein the fraction of the power transferred from the output side to the input side over the isolation structure has a time-varying component, and wherein a pulse generator on the output side has an adjustable switching frequency and/or amplitude for conveying the sensed parameter received at the sensor pin to the input side over the isolation structure.

Example 7. The gate driver of example 6, wherein a frequency and/or amplitude detector on the input side is configured to detect the sensed parameter conveyed from the output side to the input side over the isolation structure based on the switching frequency and/or amplitude.

Example 8. The gate driver of example 6 or 7, further comprising: an error detection pin at the input side for outputting an error detection signal, wherein the input side is configured to generate the error detection signal if the sensed parameter conveyed from the output side to the input side over the isolation structure indicates an error.

Example 9. The gate driver of example 8, further comprising: a restart pin at the input side for receiving a restart signal, wherein the input side is configured to clear an indication of the error and restart operation of the gate driver.

Example 10. The gate driver of any of examples 1 through 9, wherein the input side and the output side are each configured to implement a calibration process during startup of the gate driver.

Example 11. The gate driver of example 10, wherein as part of the calibration process, the output side is configured to begin transfer of a fraction of the power received at the power supply pin to the input side over the isolation structure, monitor an input-side load impedance as seen by the output side for settling, monitor changes in the input-side load impedance after settling, and initiate switching frequency modulation with the input side over the isolation structure, and wherein as part of the calibration process, the input side is configured to stabilize an internal supply of the input side based on the fraction of the power transferred from the output side to the input side over the isolation structure, activate modulation of the input-side load impedance, and detect the switching frequency modulation initiated by the output side.

Example 12. The gate driver of any of examples 1 through 11, wherein the isolation structure is a coreless transformer comprising a first coil electrically connected to the input side, a second coil electrically connected to the output side, and an isolation barrier separating the first coil and the second coil from one another.

Example 13. The gate driver of any of examples 1 through 12, wherein the isolation structure is a capacitive coupler comprising a first field plate electrically connected to the input side, a second field plate electrically connected to the output side, and an isolation barrier separating the first field plate and the second field plate from one another.

Example 14. A power electronic system, comprising: a power transistor module; a controller; a power supply; and a gate driver comprising: an input pin for receiving switching control information from the controller; an output pin for driving a control terminal of a power transistor included in the power transistor module; a power supply pin for receiving power from the power supply; an input side electrically connected to the input pin; an output side electrically connected to the output pin and the power supply pin; and an isolation structure galvanically isolating the input side and the output side from one another such that the controller is galvanically isolated from the power transistor module, wherein the output side is configured to transfer a fraction of the power received at the power supply pin to the input side over the isolation structure for powering the input side, wherein the input side is configured to convey the switching control information received at the input pin to the output side over the isolation structure.

Example 15. The power electronic system of example 14, wherein the input side of the gate driver is configured to convey the switching control information received at the input pin of the gate driver to the output side of the gate driver over the isolation structure by modulating a load impedance for the input side of the gate driver as seen by the output side of the gate driver.

Example 16. The power electronic system of example 15, wherein the fraction of the power transferred from the output side of the gate driver to the input side of the gate driver over the isolation structure includes a time-varying component having a slope effected by the modulated load impedance, and wherein the output side of the gate driver is configured to detect the slope of the time-varying component and drive the output pin based on the detected slope.

Example 17. The power electronic system of example 16, wherein the switching control information received at the input pin of the gate driver is a PWM (pulse width modulation) signal having a logic low level and a logic high level, wherein the input side of the gate driver is configured to change the load impedance each time the PWM signal transitions from the logic low level to the logic high level or from the logic high level to the logic low level, wherein the output side of the gate driver is configured to drive the output pin of the gate driver to a first voltage level if the detected slope is below a threshold and to a second voltage level if the detected slope exceeds the threshold, wherein the first voltage level corresponds to the logic low level of the PWM signal, and wherein the second voltage level corresponds to the logic high level of the PWM signal.

Example 18. The power electronic system of any of examples 14 through 17, wherein the gate driver further comprises a sensor pin at the output side of the gate driver for receiving a sensed parameter of the power transistor, and wherein the output side of the gate driver is configured to convey the sensed parameter received at the sensor pin of the gate driver to the input side of the gate driver over the isolation structure.

Example 19. The power electronic system of example 18, wherein the fraction of the power transferred from the output side of the gate driver to the input side of the gate driver over the isolation structure has a time-varying component, and wherein a pulse generator on the output side of the gate driver has an adjustable switching frequency and/or amplitude for conveying the sensed parameter received at the sensor pin of the gate driver to the input side of the gate driver over the isolation structure.

Example 20. The power electronic system of example 19, wherein a frequency and/or amplitude detector on the input side of the gate driver is configured to detect the sensed parameter conveyed from the output side of the gate driver to the input side of the gate driver over the isolation structure based on the switching frequency and/or amplitude.

Example 21. The power electronic system of any of examples 14 through 20, wherein the input side of the gate driver and the output side of the gate driver are each configured to implement a calibration process during startup of the gate driver.

Example 22. The power electronic system of example 21, wherein as part of the calibration process, the output side of the gate driver is configured to begin transfer of a fraction of the power received at the power supply pin of the gate driver to the input side of the gate driver over the isolation structure, monitor an input-side load impedance as seen by the output side of the gate driver for settling, monitor changes in the input-side load impedance after settling, and initiate switching frequency modulation with the input side of the gate driver over the isolation structure, and wherein as part of the calibration process, the input side of the gate driver is configured to stabilize an internal supply of the input side of the gate driver based on the fraction of the power transferred from the output side of the gate driver to the input side of the gate driver over the isolation structure, activate modulation of the input-side load impedance, and detect the switching frequency modulation initiated by the output side of the gate driver.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A gate driver, comprising:
    an input pin for receiving switching control information from a controller;
    an output pin for driving a control terminal of a power transistor;
    a power supply pin for receiving power from an external supply;
    an input side electrically connected to the input pin;
    an output side electrically connected to the output pin and the power supply pin; and
    an isolation structure galvanically isolating the input side and the output side from one another,
    wherein the output side is configured to transfer a fraction of the power received at the power supply pin to the input side over the isolation structure for powering the input side,
    wherein the input side is configured to convey the switching control information received at the input pin to the output side over the isolation structure.

2. The gate driver of claim 1, wherein the input side is configured to convey the switching control information received at the input pin to the output side over the isolation structure by modulating a load impedance for the input side as seen by the output side.

3. The gate driver of claim 2, wherein the fraction of the power transferred from the output side to the input side over the isolation structure includes a time-varying component having a slope effected by the modulated load impedance, and wherein the output side is configured to detect the slope of the time-varying component and drive the output pin based on the detected slope.

4. The gate driver of claim 3, wherein the switching control information received at the input pin is a PWM (pulse width modulation) signal having a logic low level and a logic high level, wherein the input side is configured to change the load impedance each time the PWM signal transitions from the logic low level to the logic high level or from the logic high level to the logic low level, wherein the output side is configured to drive the output pin to a first voltage level if the detected slope is below a threshold and to a second voltage level if the detected slope exceeds the threshold, wherein the first voltage level corresponds to the logic low level of the PWM signal, and wherein the second voltage level corresponds to the logic high level of the PWM signal.

5. The gate driver of claim 1, further comprising:
    a sensor pin at the output side for receiving a sensed parameter of the power transistor,
    wherein the output side is configured to convey the sensed parameter received at the sensor pin to the input side over the isolation structure.

6. The gate driver of claim 5, wherein the fraction of the power transferred from the output side to the input side over the isolation structure has a time-varying component, and wherein a pulse generator on the output side has an adjustable switching frequency and/or amplitude for conveying the sensed parameter received at the sensor pin to the input side over the isolation structure.

7. The gate driver of claim 6, wherein a frequency and/or amplitude detector on the input side is configured to detect the sensed parameter conveyed from the output side to the input side over the isolation structure based on the switching frequency and/or amplitude.

8. The gate driver of claim 6, further comprising:
an error detection pin at the input side for outputting an error detection signal,
wherein the input side is configured to generate the error detection signal if the sensed parameter conveyed from the output side to the input side over the isolation structure indicates an error.

9. The gate driver of claim 8, further comprising:
a restart pin at the input side for receiving a restart signal, wherein the input side is configured to clear an indication of the error and restart operation of the gate driver.

10. The gate driver of claim 1, wherein the input side and the output side are each configured to implement a calibration process during startup of the gate driver.

11. The gate driver of claim 10, wherein as part of the calibration process, the output side is configured to begin transfer of the fraction of the power received at the power supply pin to the input side over the isolation structure, monitor an input-side load impedance as seen by the output side for settling, monitor changes in the input-side load impedance after settling, and initiate switching frequency modulation with the input side over the isolation structure, and wherein as part of the calibration process, the input side is configured to stabilize an internal supply of the input side based on the fraction of the power transferred from the output side to the input side over the isolation structure, activate modulation of the input-side load impedance, and detect the switching frequency modulation initiated by the output side.

12. The gate driver of claim 1, wherein the isolation structure is a coreless transformer comprising a first coil electrically connected to the input side, a second coil electrically connected to the output side, and an isolation barrier separating the first coil and the second coil from one another.

13. The gate driver of claim 1, wherein the isolation structure is a capacitive coupler comprising a first field plate electrically connected to the input side, a second field plate electrically connected to the output side, and an isolation barrier separating the first field plate and the second field plate from one another.

14. A power electronic system, comprising:
a power transistor module;
a controller;
a power supply; and
a gate driver comprising:
an input pin for receiving switching control information from the controller;
an output pin for driving a control terminal of a power transistor included in the power transistor module;
a power supply pin for receiving power from the power supply;
an input side electrically connected to the input pin;
an output side electrically connected to the output pin and the power supply pin; and
an isolation structure galvanically isolating the input side and the output side from one another such that the controller is galvanically isolated from the power transistor module,
wherein the output side is configured to transfer a fraction of the power received at the power supply pin to the input side over the isolation structure for powering the input side,
wherein the input side is configured to convey the switching control information received at the input pin to the output side over the isolation structure.

15. The power electronic system of claim 14, wherein the input side of the gate driver is configured to convey the switching control information received at the input pin of the gate driver to the output side of the gate driver over the isolation structure by modulating a load impedance for the input side of the gate driver as seen by the output side of the gate driver.

16. The power electronic system of claim 15, wherein the fraction of the power transferred from the output side of the gate driver to the input side of the gate driver over the isolation structure includes a time-varying component having a slope effected by the modulated load impedance, and wherein the output side of the gate driver is configured to detect the slope of the time-varying component and drive the output pin based on the detected slope.

17. The power electronic system of claim 16, wherein the switching control information received at the input pin of the gate driver is a PWM (pulse width modulation) signal having a logic low level and a logic high level, wherein the input side of the gate driver is configured to change the load impedance each time the PWM signal transitions from the logic low level to the logic high level or from the logic high level to the logic low level, wherein the output side of the gate driver is configured to drive the output pin of the gate driver to a first voltage level if the detected slope is below a threshold and to a second voltage level if the detected slope exceeds the threshold, wherein the first voltage level corresponds to the logic low level of the PWM signal, and wherein the second voltage level corresponds to the logic high level of the PWM signal.

18. The power electronic system of claim 14, wherein the gate driver further comprises a sensor pin at the output side of the gate driver for receiving a sensed parameter of the power transistor, and wherein the output side of the gate driver is configured to convey the sensed parameter received at the sensor pin of the gate driver to the input side of the gate driver over the isolation structure.

19. The power electronic system of claim 18, wherein the fraction of the power transferred from the output side of the gate driver to the input side of the gate driver over the isolation structure has a time-varying component, and wherein a pulse generator on the output side of the gate driver has an adjustable switching frequency and/or amplitude for conveying the sensed parameter received at the sensor pin of the gate driver to the input side of the gate driver over the isolation structure.

20. The power electronic system of claim 19, wherein a frequency and/or amplitude detector on the input side of the gate driver is configured to detect the sensed parameter conveyed from the output side of the gate driver to the input side of the gate driver over the isolation structure based on the switching frequency and/or amplitude.

21. The power electronic system of claim 14, wherein the input side of the gate driver and the output side of the gate driver are each configured to implement a calibration process during startup of the gate driver.

22. The power electronic system of claim 21, wherein as part of the calibration process, the output side of the gate driver is configured to begin transfer of the fraction of the power received at the power supply pin of the gate driver to the input side of the gate driver over the isolation structure, monitor an input-side load impedance as seen by the output side of the gate driver for settling, monitor changes in the input-side load impedance after settling, and initiate switching frequency modulation with the input side of the gate driver over the isolation structure, and wherein as part of the calibration process, the input side of the gate driver is configured to stabilize an internal supply of the input side of the gate driver based on the fraction of the power transferred from the output side of the gate driver to the input side of the gate driver over the isolation structure, activate modulation of the input-side load impedance, and detect the switching frequency modulation initiated by the output side of the gate driver.

\* \* \* \* \*